United States Patent
Ho et al.

(10) Patent No.: US 8,420,301 B2
(45) Date of Patent: Apr. 16, 2013

(54) METHOD FOR FORMING A WIRING PATTERN BY LASER IRRADIATION

(75) Inventors: Chien-Han Ho, Taipei (TW); Hua-Min Huang, Taoyuan (TW)

(73) Assignee: Cretec Co., Ltd., Taoyuan (TW)

( * ) Notice: Subject to any disclaimer, the term of this patent is extended or adjusted under 35 U.S.C. 154(b) by 193 days.

(21) Appl. No.: 13/036,634

(22) Filed: Feb. 28, 2011

(65) Prior Publication Data

US 2012/0219918 A1    Aug. 30, 2012

(51) Int. Cl.
*G03F 7/26* (2006.01)
(52) U.S. Cl.
USPC ............................................ 430/315; 430/313
(58) Field of Classification Search .................. 430/311, 430/315
See application file for complete search history.

(56) References Cited

U.S. PATENT DOCUMENTS

2007/0151099 A1*  7/2007  Tsakalakos ..................... 29/846
2011/0053094 A1*  3/2011  Yang et al. .................... 430/320

* cited by examiner

*Primary Examiner* — Kathleen Duda
(74) *Attorney, Agent, or Firm* — Muncy, Geissler, Olds & Lowe, PLLC

(57) ABSTRACT

A method for forming a wiring pattern by laser irradiation includes the steps of coating a light-sensitive material on a substrate to form a light-sensitive layer, irradiating a laser beam on the light-sensitive material of the substrate to form a pattern including an exposed region exposed to laser irradiation and an unexposed region unexposed to laser irradiation, and forming a metallic wiring pattern by immersing the substrate into a solution having a plurality of metallic nano-particles. The metallic nano-particles are easily bonded to the straighter molecular structure of the light-sensitive material in the exposed region for forming a conducting wiring pattern. The laser irradiation method has advantages such as high-power, high-density, high-directionality and monochromaticity, such that product quality can be effectively controlled. Moreover, the laser irradiated light-sensitive material can form a molecular structure that is easily bonded to the metallic particles. As a result, the chemical wastes are substantially reduced.

3 Claims, 3 Drawing Sheets

METHOD FOR FORMING A WIRING PATTERN BY LASER IRRADIATION

BACKGROUND OF THE INVENTION

1. Field of the Invention

The present invention generally relates to a method for forming a wiring pattern by laser irradiation, and in particular to a method using laser to irradiate a light-sensitive material to form a pattern and the irradiated light-sensitive material attaching metallic nano-particles to form a metallic wiring pattern.

2. The Prior Arts

Conventional printing methods for forming a wiring pattern on a substrate can be classified generally into a subtractive method and an additive method. The subtractive method generally uses photolithography or a pattern mask to etch a portion of a metallic layer on the substrate, thereby forming a wiring pattern. Subsequently, the photo-resist layer is removed. One of the disadvantages associated with this method is that it requires multiple electro-chemical processing steps such as electro-plating, chemical etching, chemical stripping, and cleaning, which produces a significant amount of chemical wastes that may be a source of pollution if the chemical wastes are discharged to the environment without proper post-treatment.

The additive method generally forms the metallic wiring pattern on the substrate by deposition techniques, such as evaporation deposition, sputtering deposition or chemical vapor deposition. However, the equipment utilized in the additive method is usually more expensive and takes more space. In addition, the additive method requires stricter processing conditions and processing environment. Moreover, proper maintenance of the equipment directly affects the quality of the products produced using the additive method, which requires a stricter control procedure.

SUMMARY OF THE INVENTION

An objective of the present invention is to provide a method for forming a wiring pattern by laser irradiation which overcomes the aforementioned disadvantages of the conventional methods. The method may include the steps of coating a light-sensitive material on a substrate to form a light-sensitive layer, irradiating a laser beam onto the light-sensitive layer, and forming a metallic wiring pattern. In the step of laser irradiation, the substrate is placed in a laser exposure equipment, and a laser beam is irradiated onto the light-sensitive layer of the substrate to form a pattern which includes an exposed region exposed to laser irradiation and an unexposed region unexposed to laser irradiation. According to an embodiment, the light-sensitive material may include a thiophenol-azobenzene derivative). For example, in the exposed regions, molecular structure of the thiophenol-azobenzene derivative is changed into a trans-isomer straighter molecular structure; whereas molecular structure of the thiophenol-azobenzene derivative in the unexposed regions remains a cis-isomer curved molecular structure. According to another embodiment, the wavelength of the laser beam that can change the molecular structure of the light-sensitive material may be in the ultraviolet range of wavelength.

In the step of forming a metallic wiring pattern, the substrate having the exposed and unexposed regions is immersed into a liquid solution having metallic nano-particles. Because of the trans-isomer straighter molecular structure in the exposed regions, the metallic nano-particles are easily bonded to the light-sensitive material in the exposed regions for forming a metallic wiring pattern.

Another objective of the present invention includes the use of laser irradiation for forming straighter molecular structures, such that metallic particles may be easily attached to form a metallic wiring pattern. The laser irradiation method according to the present invention has advantages, such as high power, high density, high directionality and monochromaticity, and therefore the product quality can be effectively controlled. Moreover, the laser irradiated light-sensitive material forms a molecular structure that is easily bonded to the metallic particles for forming the wiring pattern. As a result, chemical wastes produced from the conventional methods are substantially reduced.

It is to be understood that both the foregoing description and the following description are exemplary and explanatory only and are not restrictive of the invention, as claimed.

The accompanying drawings, which are incorporated in and constitute a part of this specification, illustrate exemplary embodiments of the invention and together with the description, serve to explain the principles of the invention.

DETAILED DESCRIPTION OF THE PREFERRED EMBODIMENTS

Figure 1:
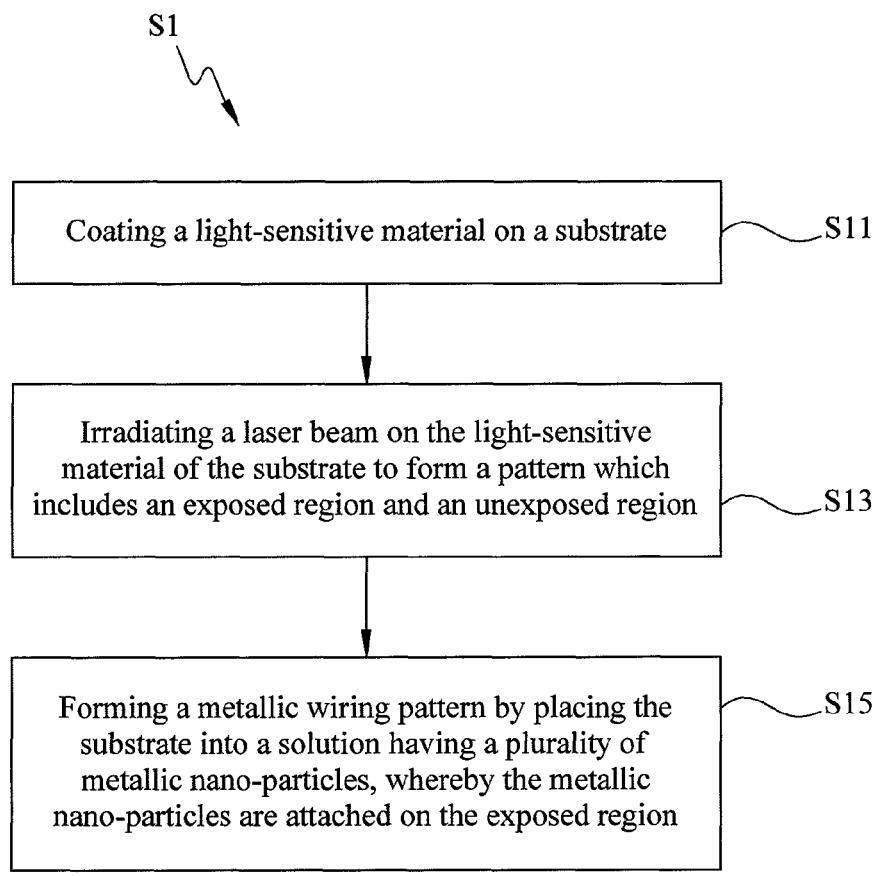
FIG. 1 is a flowchart illustrating an exemplary method for forming a wiring pattern by laser irradiation according to the present invention.
Figure 2A:
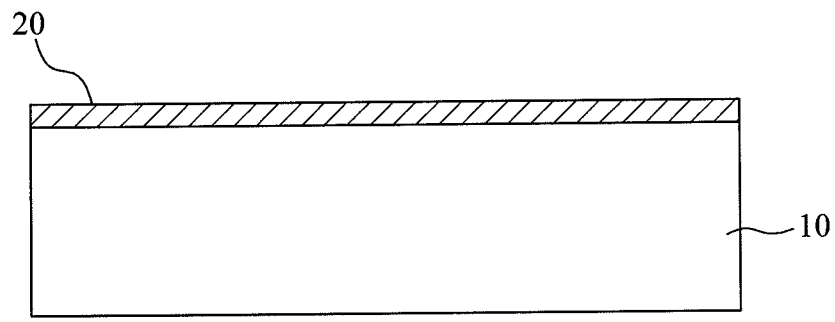
FIGS. 2A-2D are schematic views illustrating the steps of the exemplary method of FIG. 1.

FIG. 1 is a flowchart illustrating a method S1 for forming a wiring pattern by laser irradiation according to an embodiment of the present invention and FIGS. 2A-2D illustrating the steps of the method S1. The method S1 comprises the step (S11) of coating a light-sensitive material on a substrate 10 to form a light-sensitive layer 20 as shown in FIG. 2A.

Figure 2B:
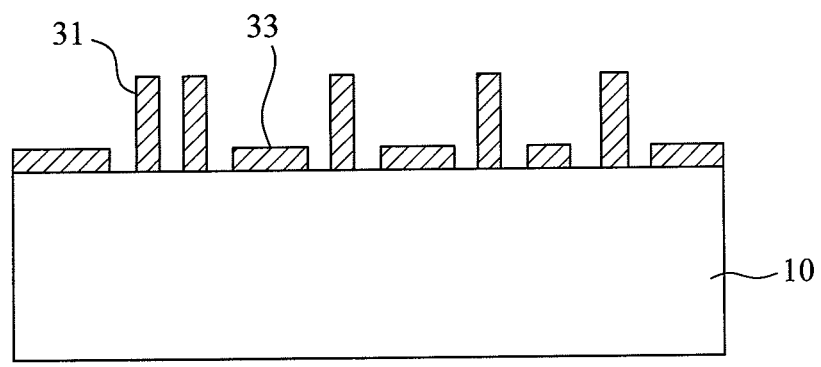

The method S1 comprises the step (S12) of placing the substrate 10 having the light-sensitive layer 20 in a laser exposure equipment and irradiating a laser beam on the light-sensitive layer 20 to form a pattern that includes one or more exposed regions 31 exposed to laser irradiation and one or more unexposed regions 33 unexposed to laser irradiation as shown in FIG. 2B. The molecular structure of the light-sensitive material in the one or more unexposed regions 33 may have a cis-isomer slightly curved molecular structure. After laser irradiation, the molecular structure of the light-sensitive material in the one or more exposed regions 31 may be changed into a trans-isomer straighter molecular structure.

Figure 2C:
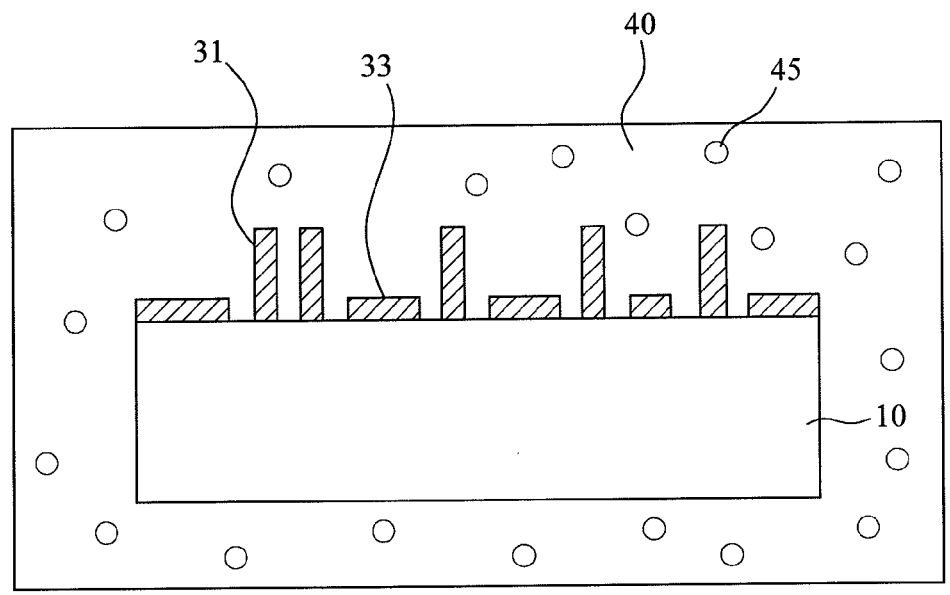
Figure 2D:
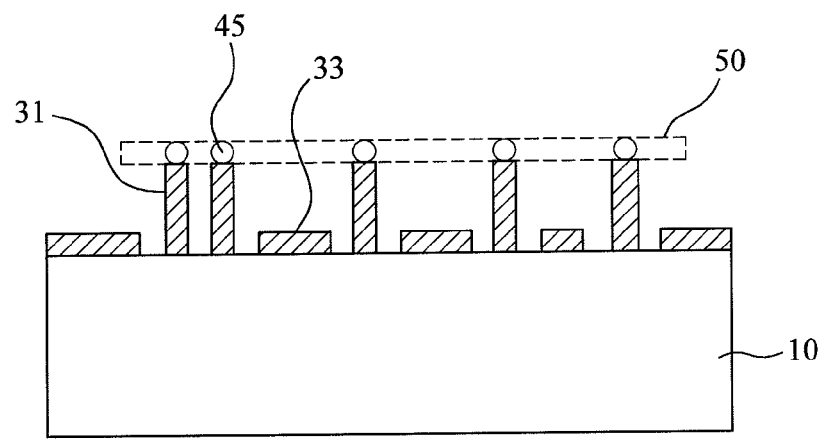

The method S1 comprises the step (S15) of forming a wiring pattern. Referring to FIGS. 2C and 2D, the substrate 10 having the one or more exposed regions 31 and the one or more unexposed regions 33 is immersed in a liquid solution 40 including a plurality of metallic nano-particles 45. Due to the trans-isomer straighter molecular structure in the one or more exposed regions 31, the metallic nano-particles 45 may be easily attached to the light-sensitive material in the one or more exposed regions 31. After the substrate 10 is removed from the liquid solution 40 and undergoes cleaning and drying, the metallic nano-particles 45 may be attached to the light-sensitive material in the regions 31 thereby forming a metallic wiring pattern 50.

According to the present invention, the light-sensitive material may include at least a thiophenol-azobenzene derivative). The wavelength of the laser beam that can change the molecular structure of the light-sensitive material may be in the ultraviolet range of wavelength, and after laser irradiation the molecular structure of the thiophenol-azobenzene derivative is changed from a cis-isomer molecular structure into a trans-isomer molecular structure for easily attaching the metallic nano-particles.

The invention as described herein includes the use of patterning laser irradiation for forming straighter molecular structures, such that the metallic particles 45 may be easily attached to form the metallic wiring pattern 50. The laser irradiation has multiple advantages, such as high power, high density, high directionality and monochromaticity, such that product quality can be effectively controlled. Moreover, the laser irradiated light-sensitive material can form the trans-isomer straighter molecular structure that may be easily attached with metallic particles. As a result, chemical wastes can be substantially reduced.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method for forming a wiring pattern by laser irradiation, comprising the steps of:
    coating a light-sensitive material including a thiophenol-azobenzene derivative on a substrate to form a light-sensitive layer;
    irradiating a laser beam on the light-sensitive material of the substrate to form a pattern which includes an exposed region and an unexposed region; and
    forming a metallic wiring pattern by placing the substrate into a solution having a plurality of metallic nano-particles, whereby the metallic nano-particles are attached to the exposed region,
    wherein a molecular structure of the thiophenol-azobenzene derivative of the light-sensitive material in the exposed region is changed from a cis-isomer molecular structure into a trans-isomer molecular structure by laser irradiation.

2. The method as claimed in claim 1, wherein a wavelength of the laser beam is in an ultraviolet range of wavelengths.

3. The method as claimed in claim 1, further comprising the step of cleaning and drying the substrate having the metallic wiring pattern.

\* \* \* \* \*